US009570275B2

(12) United States Patent
Carducci et al.

(10) Patent No.: US 9,570,275 B2
(45) Date of Patent: Feb. 14, 2017

(54) HEATED SHOWERHEAD ASSEMBLY

(71) Applicant: Applied Materials, Inc., Santa Clara, CA (US)

(72) Inventors: James D. Carducci, Sunnyvale, CA (US); Olga Regelman, Daly City, CA (US); Kallol Bera, San Jose, CA (US); Douglas A. Buchberger, Jr., Livermore, CA (US); Paul Brillhart, Pleasanton, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 118 days.

(21) Appl. No.: 14/531,831

(22) Filed: Nov. 3, 2014

(65) Prior Publication Data

US 2015/0053794 A1 Feb. 26, 2015

Related U.S. Application Data

(62) Division of application No. 11/972,072, filed on Jan. 10, 2008, now Pat. No. 8,876,024.

(51) Int. Cl.
*B05B 1/14* (2006.01)
*B05B 1/24* (2006.01)
(Continued)

(52) U.S. Cl.
CPC .......... *H01J 37/3244* (2013.01); *B32B 43/00* (2013.01); *C23C 16/4412* (2013.01);
(Continued)

(58) Field of Classification Search
CPC .............. B05B 1/14; B05B 1/18; B05B 1/185; C23C 16/45565; C23C 16/4557; C23C 16/4412; C23C 16/45591; H01J 37/32724; H01J 37/32449; H01J 37/3244; H01J 2237/3343; B32B 43/00; Y10T 29/49815
(Continued)

(56) References Cited

U.S. PATENT DOCUMENTS 2,554,829 A 5/1951 Jeurling
2,618,322 A 11/1952 Conta et al.
(Continued)

FOREIGN PATENT DOCUMENTS

JP 2002-8995 A 1/2002
JP 2002-155364 A 5/2002
(Continued)

OTHER PUBLICATIONS

PCT Notification of Transmittal of the International Search Report and the Written Opinion of the International Searching Authority for International Application No. PCT/US2009/030267 dated Jul. 23, 2009; 10 total pages.
(Continued)

*Primary Examiner* — Christopher Kim
(74) *Attorney, Agent, or Firm* — Patterson & Sheridan, LLP

(57) ABSTRACT

The present disclosure generally comprises a heated showerhead assembly that may be used to supply processing gases into a processing chamber. The processing chamber may be an etching chamber. When processing gas is evacuated from the processing chamber, the uniform processing of the substrate may be difficult. As the processing gas is pulled away from the substrate and towards the vacuum pump, the plasma, in the case of etching, may not be uniform across the substrate. Uneven plasma may lead to uneven etching. To prevent uneven etching, the showerhead assembly may be separated into two zones each having independently controllable gas introduction and temperature control. The first (Continued)

zone corresponds to the perimeter of the substrate while the second zone corresponds to the center of the substrate. By independently controlling the temperature and the gas flow through the showerhead zones, etching uniformity of the substrate may be increased.

13 Claims, 7 Drawing Sheets

(51) Int. Cl.
    *H01J 37/32*     (2006.01)
    *C23C 16/44*     (2006.01)
    *C23C 16/455*     (2006.01)
    *B32B 43/00*     (2006.01)

(52) U.S. Cl.
    CPC .... *C23C 16/4557* (2013.01); *C23C 16/45565* (2013.01); *C23C 16/45591* (2013.01); *H01J 37/32449* (2013.01); *H01J 37/32724* (2013.01); *H01J 2237/3343* (2013.01); *Y10T 29/49815* (2015.01)

(58) Field of Classification Search
    USPC .................................. 239/556–561, 565, 135
    See application file for complete search history.

(56) References Cited

U.S. PATENT DOCUMENTS

| | | |
|---|---|---|
| 2,745,476 A | 5/1956 | Teti |
| 3,404,845 A | 10/1968 | Schmeling et al. |
| 5,243,841 A | 9/1993 | Fleissner |
| 5,556,501 A | 9/1996 | Collins et al. |
| 5,824,605 A | 10/1998 | Chen et al. |
| 5,976,261 A | 11/1999 | Moslehi et al. |
| 6,035,101 A | 3/2000 | Sajoto et al. |
| 6,054,013 A | 4/2000 | Collins et al. |
| 6,206,972 B1 | 3/2001 | Dunham |
| 6,446,573 B2 | 9/2002 | Hirayama et al. |
| 6,800,139 B1 | 10/2004 | Shinriki et al. |
| 6,983,892 B2 | 1/2006 | Noorbakhsh et al. |
| 7,354,622 B2 | 4/2008 | Shinriki et al. |
| 7,481,240 B2 | 1/2009 | Nagaoka et al. |
| 7,854,820 B2 | 12/2010 | De La Llera et al. |
| 8,512,509 B2 | 8/2013 | Bera et al. |
| 2002/0021545 A1 | 2/2002 | Tatsumi et al. |
| 2005/0173569 A1* | 8/2005 | Noorbakhsh ..... C23C 16/45565 239/690 |
| 2006/0046496 A1 | 3/2006 | Mui et al. |
| 2007/0042603 A1 | 2/2007 | Kropewnicki et al. |
| 2011/0120651 A1 | 5/2011 | Erenstein et al. |
| 2012/0193456 A1 | 8/2012 | Lubomirsky et al. |
| 2013/0315795 A1 | 11/2013 | Bera et al. |
| 2014/0187049 A1 | 7/2014 | Augustino et al. |
| 2015/0053794 A1 | 2/2015 | Carducci et al. |

FOREIGN PATENT DOCUMENTS

| | | |
|---|---|---|
| JP | 2005-723 A | 1/2005 |
| JP | 2006-299294 A | 11/2006 |
| KR | 10-2002-0031380 | 6/2002 |
| KR | 10-2004-0045913 | 6/2004 |
| WO | 01/16396 A1 | 3/2001 |

OTHER PUBLICATIONS

Chinese Office Action (with attached English translation) for Application No. 200980102058.4 dated Sep. 14, 2011; 8 total pages.
Chinese Office Action (with attached English translation) for Application No. 200980102058.4 dated Aug. 20, 2012; 17 total pages.
Chinese Office Action (with attached English translation) for Application No. 200980102058.4 dated Jan. 28, 2013; 11 total pages.
Taiwanese Office Action for Application No. 098100201 dated Apr. 28, 2014; 10 total pages.

* cited by examiner

HEATED SHOWERHEAD ASSEMBLY

CROSS-REFERENCE TO RELATED APPLICATIONS

This application is a divisional of U.S. patent application Ser. No. 11/972,072 filed Jan. 10, 2008, which is herein incorporated by reference, which is herein incorporated by reference.

BACKGROUND

Field

Embodiments of the present disclosure generally relate to a heated showerhead assembly.

Description of the Related Art

Integrated circuits have evolved into complex devices that can include millions of components (e.g., transistors, capacitors, resistors, and the like) on a single chip. The evolution of chip designs continually requires faster circuitry and greater circuit density. The demands for greater circuit density necessitate a reduction in the dimensions of the integrated circuit components. The minimal dimensions of features of such devices are commonly referred to in the art as critical dimensions. The critical dimensions generally include the minimal widths of the features, such as lines, columns, openings, spaces between the lines, and the like.

As these critical dimensions shrink, process uniformity across the substrate becomes paramount to maintain high yields. One problem associated with a conventional plasma etch process used in the manufacture of integrated circuits is the non-uniformity of the etch rate across the substrate, which may be due, in part, to a vacuum pump drawing the etching gas toward the exhaust port and away from the substrate. As gases are more easily pumped from areas of the chamber that are closest to the exhaust port (i.e., the periphery of the substrate), the etching gas is pulled toward the exhaust port and away from the substrate, thereby creating a non-uniform etch on the substrate positioned therein. This non-uniformity may significantly affect performance and increase the cost of fabricating integrated circuits.

Therefore, there is a need in the art for an apparatus for uniformly etching material layers during the manufacture of integrated circuits.

SUMMARY

The present disclosure generally comprises a heated showerhead assembly that may be used to supply processing gases into a processing chamber. In one embodiment, a showerhead, comprises a showerhead body having a first zone encircling a second zone. The first zone comprises a first plenum disposed on a first side of the body, one or more second plenums disposed on the second side of the body, and a plurality of first bores arranged in a plurality of first annular patterns, the plurality of first bores extending from the first plenum to the one or more second plenums. The second zone comprises a third plenum disposed on the first side of the body, one or more fourth plenums disposed on the second side of the body, and a plurality of second bores arranged in a plurality of second annular patterns, the plurality of second bores extending from the third plenum to the one or more fourth plenums.

In another embodiment, a showerhead assembly comprises a first gas distribution plate having a first side, a second side, and two or more zones, each zone having a plurality of first bores extending through the first gas distribution plate from the first side to the second side, and a second gas distribution plate having a third side, a fourth side, and a plurality of second bores extending from the third side to the fourth side through the second gas distribution plate, wherein the third side of the second gas distribution plate coupled with the second side of the first gas distribution plate, and the number of second bores exceeds the number of first bores.

In another embodiment, a method of refurbishing a showerhead comprises disassembling a first showerhead body from a second showerhead body, cleaning at least the first showerhead body, and bonding the first showerhead body to a third showerhead body. The first showerhead body has a first zone encircling a second zone. The first zone comprises a first plenum disposed on a first side of the first showerhead body, one or more second plenums disposed on the second side of the first showerhead body, and a plurality of first bores arranged in a plurality of first annular patterns, the plurality of first bores extending from the first plenum to the one or more second plenums. The second zone comprises a third plenum disposed on the first side of the first showerhead body, one or more fourth plenums disposed on the second side of the first showerhead body, and a plurality of second bores arranged in a plurality of second annular patterns, the plurality of second bores extending from the third plenum to the one or more fourth plenums.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present disclosure generally comprises a heated showerhead assembly that may be used to supply processing gases into a processing chamber. The processing chamber may be an etching chamber. When processing gas is evacuated from the processing chamber, the uniform processing of the substrate may be difficult. As the processing gas is pulled away from the substrate and towards the vacuum pump, the plasma, in the case of etching, may not be uniform across the substrate. Uneven plasma may lead to uneven etching. To prevent uneven etching, the showerhead assembly may be separated into two zones each having independently controllable gas introduction and temperature control. The first zone corresponds to the perimeter of the substrate while the second zone corresponds to the center of the substrate. By independently controlling the temperature and the gas flow through the showerhead zones, etching uniformity of the substrate may be increased.

The disclosure will be described below in relation to an etching chamber. However, a variety of plasma deposition and etching chambers may benefit from the teachings disclosed herein, and in particular, dielectric etching chambers such as the ENABLER® etch chamber, which may be part of a semiconductor wafer processing system such as the CENTURA® system, the PRODUCER® etch chamber, the eMax® etch chamber, among others, all of which are available from Applied Materials, Inc. of Santa Clara, Calif. It is contemplated that other plasma reactors, including those from other manufacturers, may be adapted to benefit from the disclosure.

Figure 1:
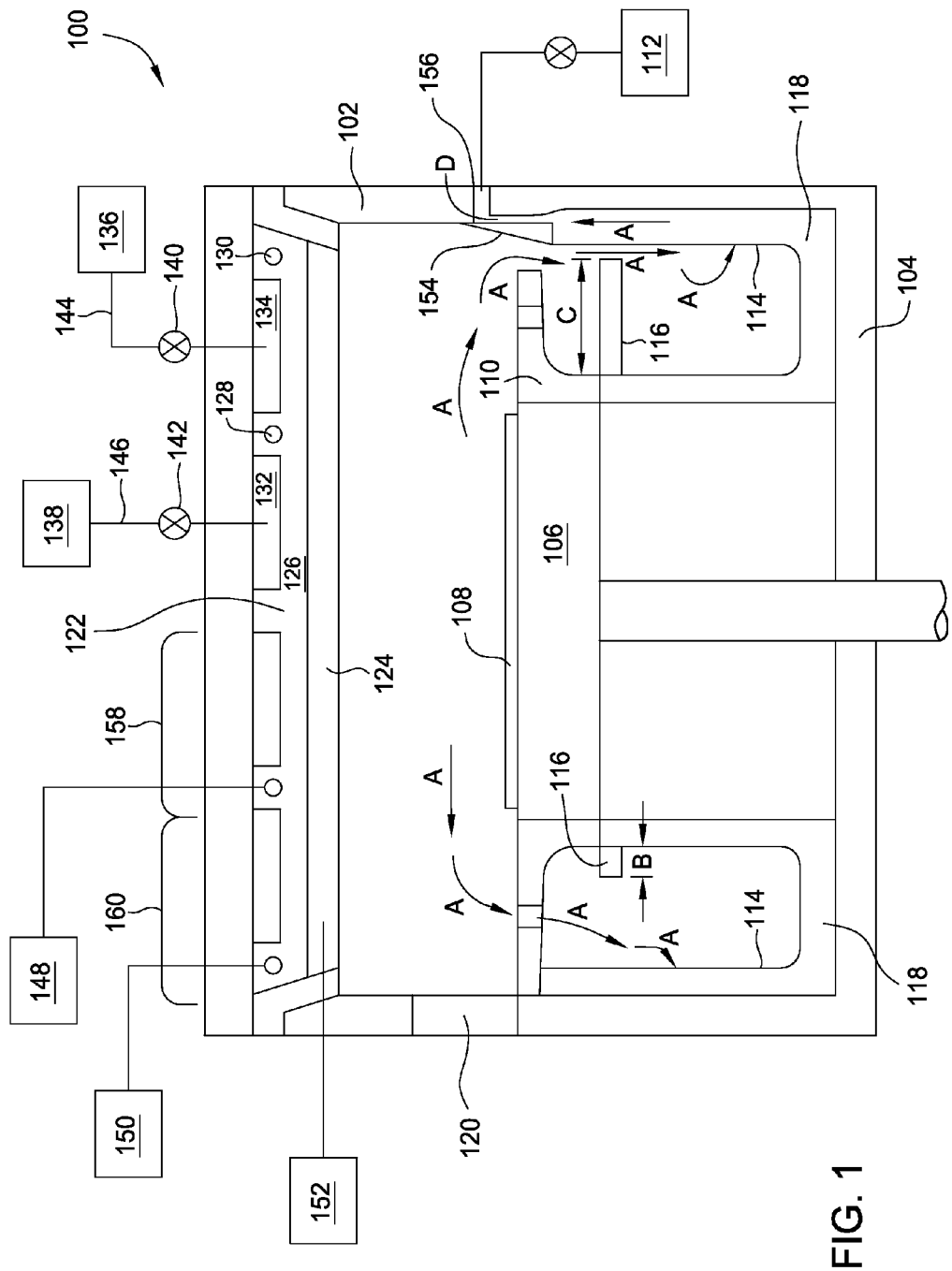
FIG. 1 is a schematic cross sectional view of an etching apparatus according to one embodiment of the disclosure.

FIG. 1 is a schematic cross sectional view of an etching apparatus according to one embodiment of the disclosure. The apparatus comprises a chamber 100 having a plurality of walls 102 extending upwards from a chamber bottom 104. Within the chamber 100, a susceptor 106 is present upon which a substrate 108 may be supported for processing. The substrate 108 may be introduced into the chamber 100 through a slit valve opening 120.

The chamber 100 may be evacuated by a vacuum pump 112 coupled to the chamber wall 102 through a vacuum port 156. The chamber 100 may be evacuated by drawing the processing gas around and through a baffle 110 that circumscribes the susceptor 106 and substrate 110. The further away from the vacuum pump 112, the less the draw of the vacuum may be detected. Conversely, the closer to the vacuum pump 112, the greater the draw of the vacuum that may be detected. Thus, to compensate for an uneven vacuum draw, a flow equalizer 116 may be disposed within the chamber 100. The flow equalizer 116 may circumscribe the susceptor 106. The width of the flow equalizer 116 may be smaller at the location further away from the vacuum port 156 as shown by arrows "B" compared to the width of the flow equalizer 116 at a location closest to the vacuum port 156 as shown by arrows "C". The gas being evacuated may flow around the flow equalizer and then through a lower liner 114. The lower liner 114 may have one or more holes therethrough to permit the processing gas to be evacuated therethrough. A space 118 is present between the lower liner 114 and the walls 102 of the chamber 100 to permit the gas to flow behind the lower liner 114 to the vacuum port 156. The vacuum port 156 may be blocked by a flow blocker 154 to prevent processing gas from being drawn directly into the vacuum pump 112 from an area close to the substrate 108. The evacuated gas may flow along a path shown by arrows "A".

Processing gas may be introduced into the processing chamber 100 through a showerhead 122. The showerhead 122 may be biased by an RF current from an RF power source 152, and the showerhead 122 may comprise a first diffuser plate 126 and a second diffuser plate 124. In one embodiment, the first diffuser plate 126 may comprise aluminum. In another embodiment, the second diffuser plate 124 may comprise silicon carbide. The first diffuser plate 126 and the second diffuser plate 124 may be bonded together. In one embodiment, the first diffuser plate 126 and the second diffuser plate 124 may be welded together. In another embodiment, the first diffuser plate 126 and the second diffuser plate 124 may be bonded together utilizing an elastomer. The showerhead 122 may be divided into an inner zone 158 and an outer zone 160. The inner zone 158 may have a heating element 128. In one embodiment, the heating element 128 may have an annular shape. The heating element 128 may be coupled with a heating source 148. The outer zone 160 may also comprise a heating element 130 coupled with a heating source 150. In one embodiment, the heating elements 128, 130 may comprise annular conduits that are filled with a heating fluid from the heating sources 148, 150. In another embodiment, the heating elements 128, 130 may comprise heating coils powered by the heating sources 148, 150. While not shown, thermocouples may provide real time temperature feedback to a controller that controls the amount of heat supplied to the inner zone 158 and the outer zone 160.

The inner zone 158 may be coupled with a gas source 138 by a conduit 146. Gas from the gas source 138 may flow through the conduit 146 to a plenum 132 disposed behind the first diffuser plate 126 of the showerhead 122. A valve 142 may be disposed along the conduit 146 to control the amount of gas that flows from the gas source 138 to the plenum 132. Once the gas enters the plenum 132, the gas may then pass through the diffuser plates 124, 126. Similarly, the outer zone 160 may be coupled with a gas source 138 by a conduit 144. A valve 140 may be disposed along the conduit 144 to control the amount of gas that flows from the gas source 136 to the plenum 134.

It is to be understood that while separate gas sources 136, 138 have been shown in FIG. 1, a single, common gas source may be utilized. When a single common gas source is utilized, separate conduits 144, 146 may be coupled to the gas source and the valves 140, 142 may control the amount of processing gas that reaches the plenums 132, 134.

Figure 2A:
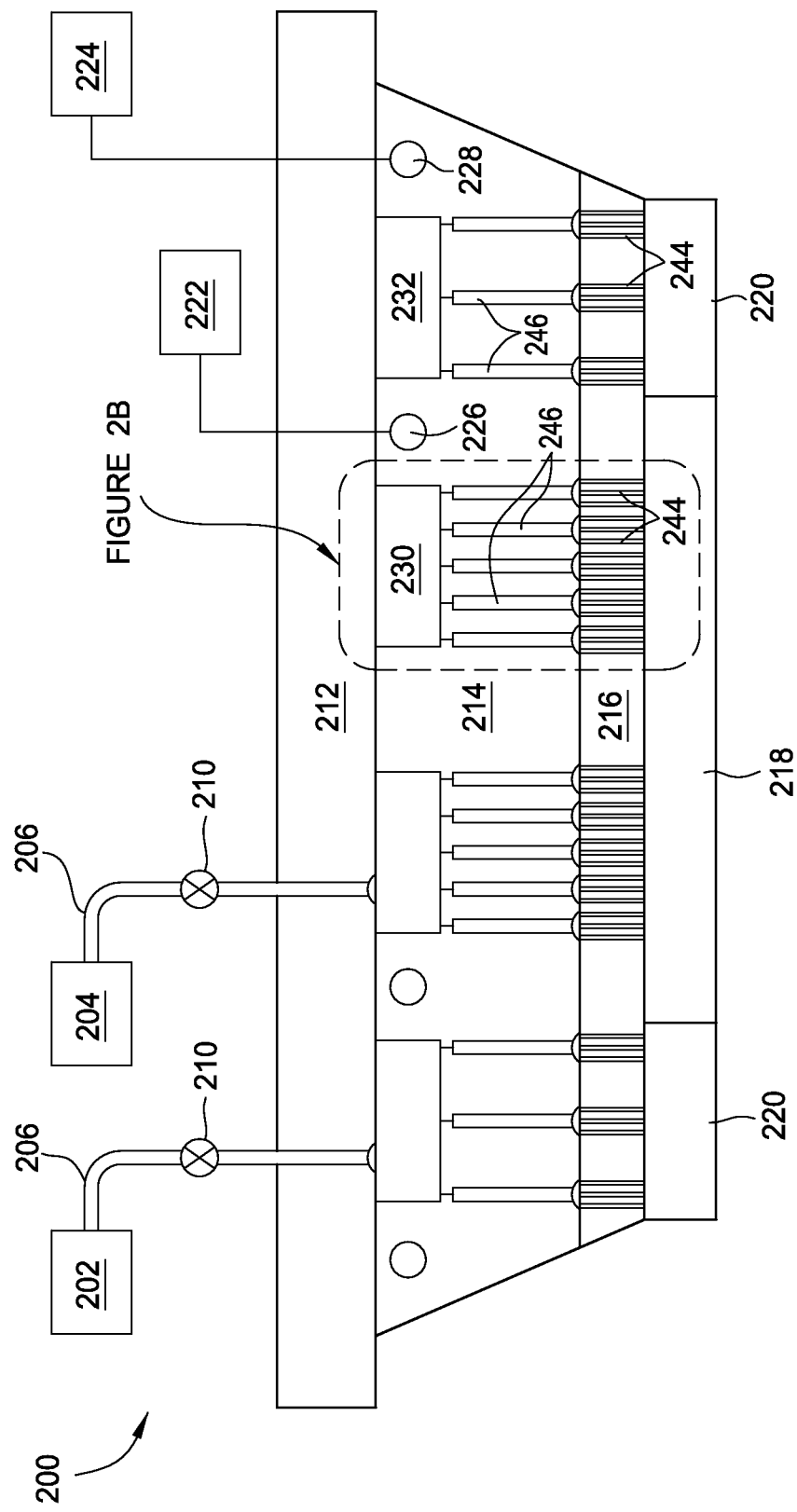
FIG. 2A is a schematic cross sectional view of a showerhead assembly 200 according to one embodiment of the disclosure.

FIG. 2A is a schematic cross sectional view of a showerhead assembly 200 according to one embodiment of the disclosure. The showerhead assembly 200 comprises a backing plate 212 coupled to a first diffuser plate 214 and a second diffuser plate 216. The showerhead assembly 200 comprises an inner zone 218 and an outer zone 220. The inner zone may be coupled to a heating source 222 that provides heat for the heating element 226. A gas source 204 may also be coupled with the inner zone 218 through a conduit 208. A valve 210 may be coupled along the conduit 208 to control the amount of processing gas provided to the plenum 230. The inner zone 218 and the outer zone 220 may be annular. A heating source 224 may also be coupled with the heating element 228 of the outer zone 220. A gas source 202 may be coupled with the plenum 232 of the outer zone 220 through a conduit 206. A valve 210 along the conduit 206 may control the amount of processing gas that reaches the plenum 232.

Figure 2B:
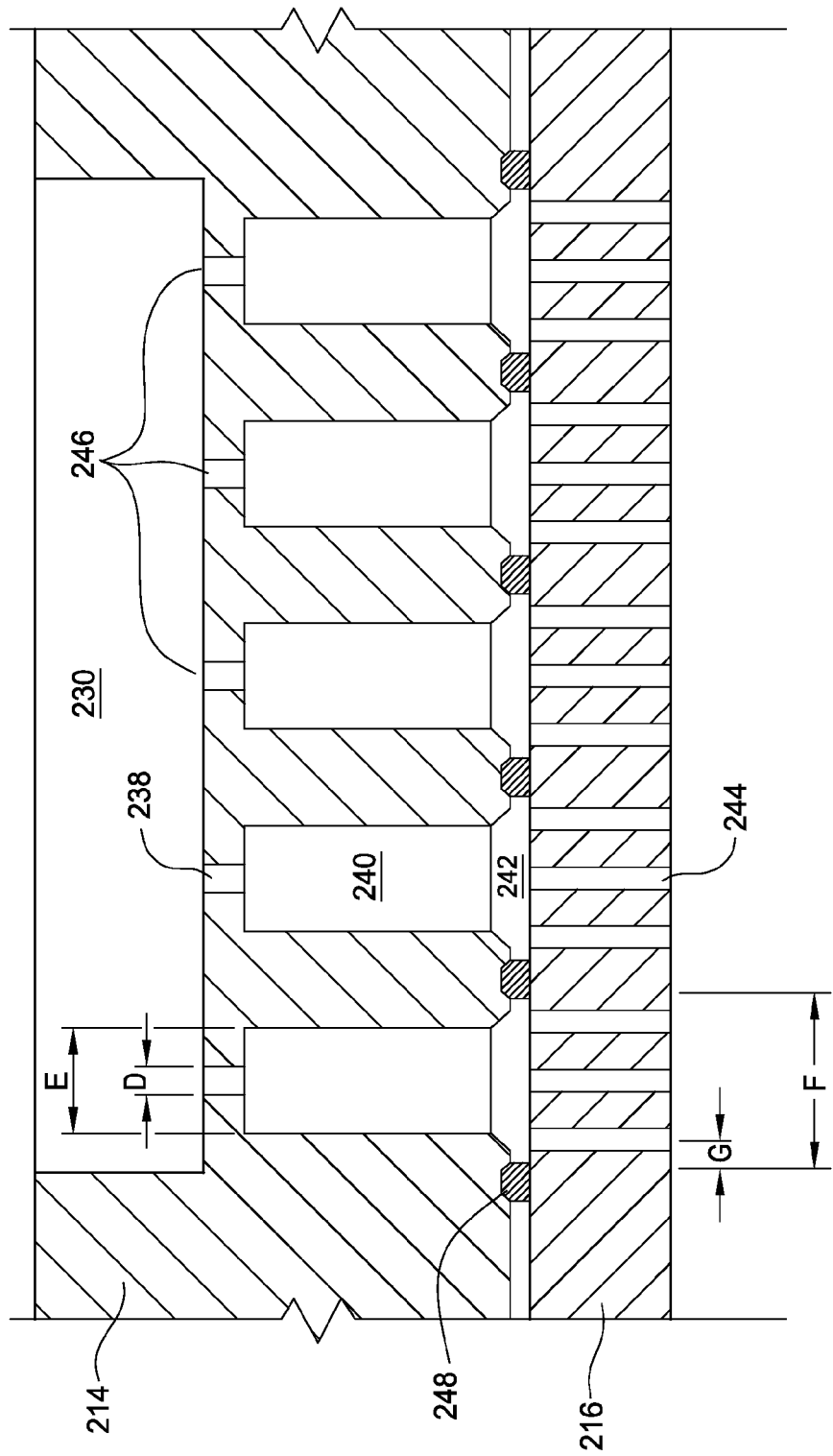
FIG. 2B is a close up view of the inner zone 218 of FIG. 2A.

FIG. 2B is a close up view of the inner zone 218 of FIG. 2A. The processing gas that enters the plenum 230 is evenly distributed within the plenum because of the orifice holes 238. The orifice holes 238 are sized to create an even distribution of process gas among the gas passages 246 of the first diffuser plate 214. The orifice holes 238 may have a diameter shown by arrows "D". Because the diameter of the orifice holes 238 is smaller than the plenum 230, processing gas may build up within the plenum and a substantially equal amount of processing gas may pass through the orifice hole 238. Once through the orifice holes, the processing gas may expand in first expanding channels 240. The first expanding channels 240 may have diameter as shown by arrows "E". The diameter of the first expanding channels 240 is greater than the diameter the orifice hole 238. The processing gas enters second expanding channels 242 after passing through the first expanding channels 240. The second expanding channels 242 have a width as shown by arrows "F".

The second diffuser plate 216 also comprises a plurality of gas passages 244. The gas passages 244 are coupled with the second expanding channels 242 of the first diffuser plate 214 such that each second expanding channel 242 forms at least one annular plenum for flowing a gas into the gas passages 244. The gas passages 244 of the second diffuser plate 216 each have a width or diameter as shown by arrows "G". The width or diameter of the gas passages 244 is less than the width or diameter of the second expanding channels 242. The second expanding channels 242 may act as a plenum for the gas passages 244 of the second diffuser plate 216. As the width or diameter of each gas passage 244 is substantially the same, the processing gas may evenly distribute within the second expanding channels 242 before entering the gas passages 244. Thus, a substantially equal amount of processing gas may flow through each gas passage 244. The gas passages 244, 246 may be bored into the diffuser plates 214, 216. The gas passages 244 collectively are arranged in an annular pattern around the diffuser plate 216. In one embodiment, the width of the annular pattern of gas passages 244 is substantially equal to the width of the second expanding channels 242.

Figure 2C:
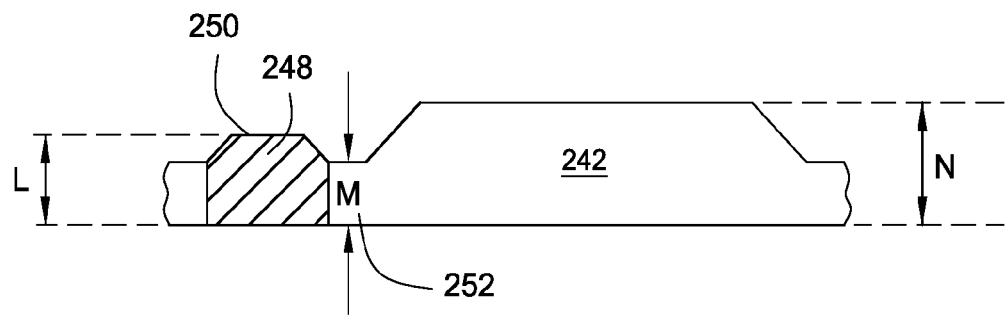
FIG. 2C is a close-up view of the interface between the first diffuser plate 214 and the second diffuser plate 216.
Figure 2D:
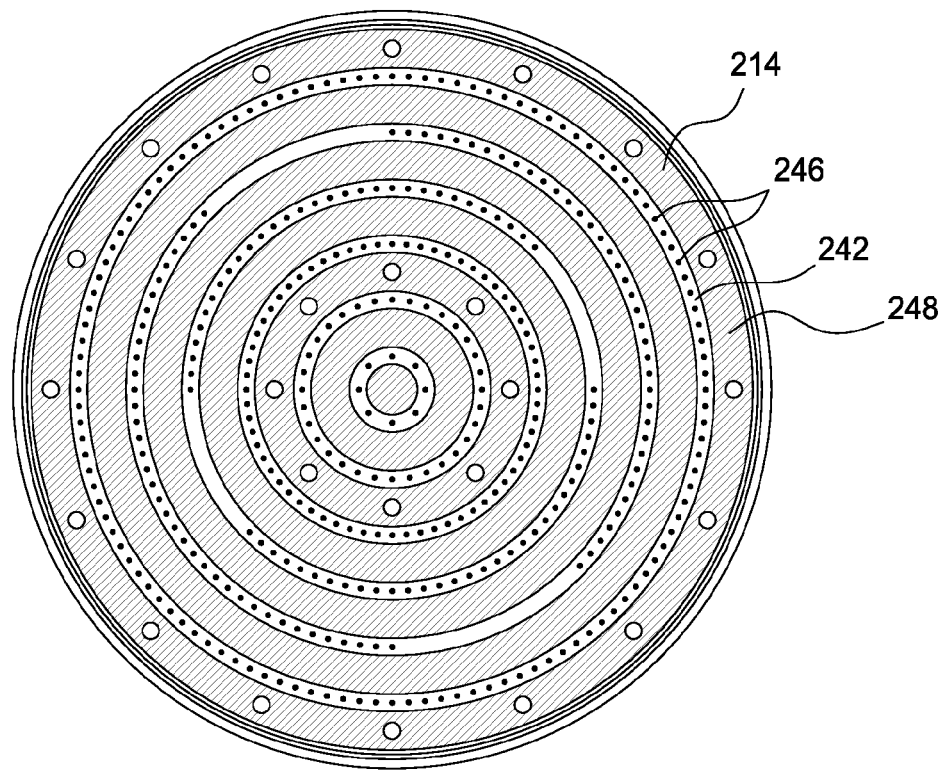
FIG. 2D is a bottom view of the first diffuser plate 214 shown in FIG. 2A.

The first diffuser plate 214 may be bonded to the second diffuser plate 216. In one embodiment, the first diffuser plate 214 may be anodized and then bonded to the second diffuser plate 216. In one embodiment, the bonding material 248 may comprise a silicone based bonding material. FIG. 2C is a close-up view of the interface between the first diffuser plate 214 and the second diffuser plate 216. As shown in FIG. 2C, the bottom surface of the first diffuser plate 214 has a plurality of expanding channels 242 into which processing gas will expand before entering the second diffuser plate 216. Each of the gas passages 246 that are arranged in an annular pattern feed into a common expanding channel 242. The expanding channel 242 may permit the processing gas to evenly distribute and then enter the gas passages 244 of the second diffuser plate 216. In one embodiment, each expanding channel 242 is an annular groove bored into the bottom surface of the first diffuser plate 214. FIG. 2D is a bottom view of the first diffuser plate 214 shown in FIG. 2A. The gas passages 246 of the first diffuser plate 214 may feed into an expanding channel 242 where the gas may evenly distribute before entering the gas passages 244 of the second diffuser plate 216.

One or more bonding grooves 250 may be bored into the first diffuser plate 214. The bonding grooves 250 may be annular channels disposed between adjacent expanding channels 242. The bonding grooves 250 may have a height as shown by arrows "L". In one embodiment, the height of the bonding grooves 250 may be less than the height, as shown by arrows "N", of the expanding channel 242. In another embodiment, the height of the bonding grooves 250 may be substantially equal to the height of the expanding channel 242. A space 252 may remain between the first diffuser plate 214 and the second diffuser plate 216. The space 252 may be disposed between the expanding channel 242 and the adjacent bonding groove 250. If the space 252 is too small, particles can be trapped therein. If the space 252 is too large, then too much bonding material 248 is exposed to the processing gas and may be attacked by the processing gas to break down the bonding material 248. The space 252 may have a height as shown by arrows "M" that is sufficiently small to reduce any bonding material 248 that may be exposed to processing gas during processing, from escaping and passing through the gas passages 244 of the second diffuser plate 216. In one embodiment, the height of the space 252 may be between about 0.005 inches to about 0.009 inches. It is to be understood that while the bonding grooves 250 have been bored into the first diffuser plate 250, the bonding grooves 250 may be bored into the second diffuser plate 216 instead so long as the bonding grooves 250 do not interfere with the gas passages 244 of the second diffuser plate 216 of compromise the structural integrity of the second diffuser plate 216.

Referring back to FIG. 2A, the inner zone 218 may have a plurality of gas passages 246 through the first diffuser plate 214. In one embodiment, five gas passages 246 may be present in the inner zone 218. The outer zone 220 may also have a plurality of gas passages 246 through the first diffuser plate 214. In one embodiment, three gas passages 246 may be present in the outer zone 220. The number of gas passages 246 within the inner zone 218 may be greater than the number of gas passages 246 within the outer zone 220. It is to be understood that more or less gas passages 246 may be utilized for the inner zone 218 and the outer zone 220 depending upon the flow characteristics of the particular chamber.

The gas flow through the inner zone 218 of the showerhead assembly 200 may be greater than the gas flow through the outer zone 220 of the showerhead assembly 200. When the vacuum is drawn in the processing chamber, the periphery of the substrate may be exposed to a greater amount of processing gas because the processing gas corresponding to the center of the substrate passes over the periphery of the substrate on the way to the vacuum pump. By having a greater gas flow in the inner zone 218 of the showerhead assembly 200, the center of the substrate may be exposed to a substantially equal amount of processing gas as the periphery of the substrate.

The showerhead assembly 200 may be debonded by heating the showerhead assembly 200 to a temperature above the melting point of the bonding material 248. Thereafter, the first diffuser plate 214 may be removed from the second diffuser plate 216 and the bonding material 248 removed. Both the first diffuser plate 214 and the second diffuser plate 216 may then be cleaned. If either plate 214, 216 is beyond repair, the plate 214, 216 may be replaced and rebonded to the other plate 214, 216. In one embodiment, the first diffuser plate 214 may be reanodized. In one embodiment, a cold debonding process may be used. The cold debonding process may comprise physically cutting the second diffuser plate 216 from the first diffuser plate 214. The bonding material 248 may then be removed from the diffuser plates 214, 216. In one embodiment, the bonding material 248 may be removed by etching. In another embodiment, the bonding material 248 may be removed by machining the bonding material by a process such as grinding.

Figure 3:
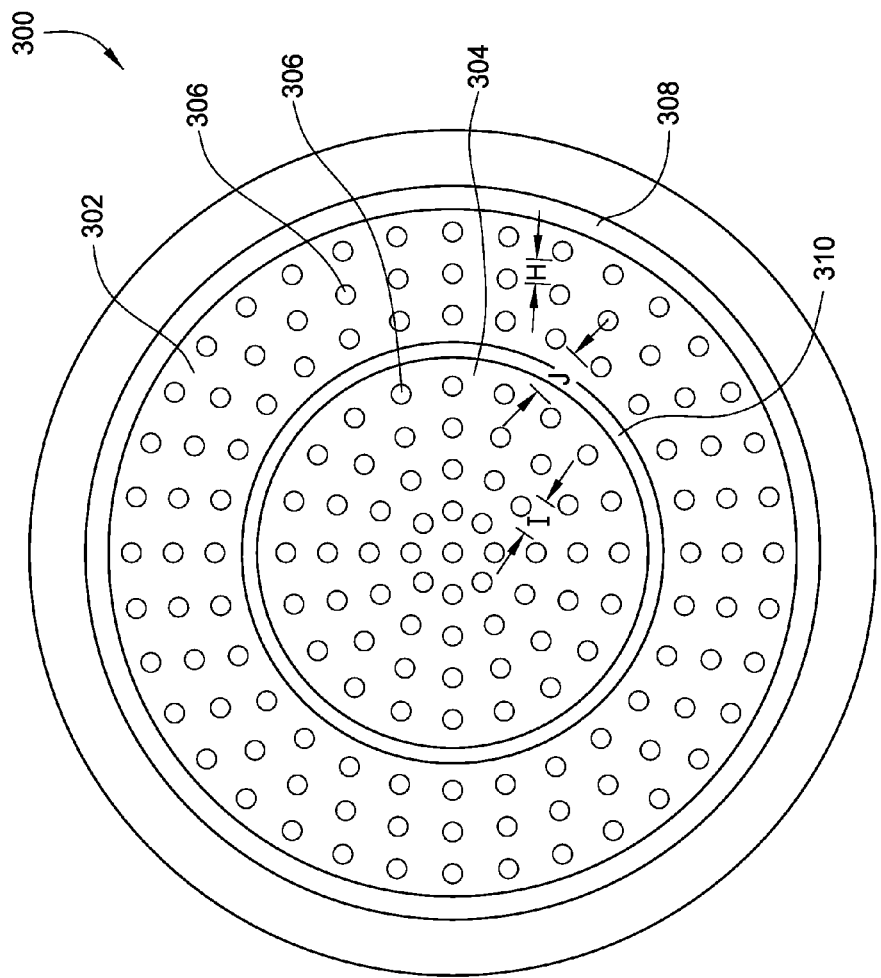
FIG. 3 is a schematic top view of a showerhead assembly 300 according to one embodiment of the disclosure.

FIG. 3 is a schematic top view of a showerhead assembly 300 according to one embodiment of the disclosure. The showerhead assembly 300 comprises an outer zone 302 and an inner zone 304. The outer zone 302 comprises a heating element 308, and the inner zone comprises a heating element 310. Within both the inner zone 304 and the outer zone 302, a plurality of orifice holes 306 are shown. Within the outer zone 302, the orifice holes 306 are arranged in three annular patterns. It is to be understood that while three annular patterns are shown, the orifice holes 306 may be arranged in more or less annular patterns. Additionally, the orifice holes 306 may be randomly dispersed within the outer zone 302. In the embodiment shown, the annular patterns are spaced apart by a distance shown by arrows "H".

Within the inner zone 304, the orifice holes 306 are arranged in five annular patterns. It is to be understood that while five annular patterns are shown, the orifice holes 306 may be arranged in more or less annular patterns. Additionally, the orifice holes 306 may be randomly dispersed within the inner zone 304. In the embodiment shown, the annular patterns are spaced apart by a distance shown by arrows "I". The distance between the annular patterns of the outer zone 302 and the inner zone 304 is shown by the arrows "J". In one embodiment, "J" is substantially equal to "I" and substantially equal to "H".

Figure 4:
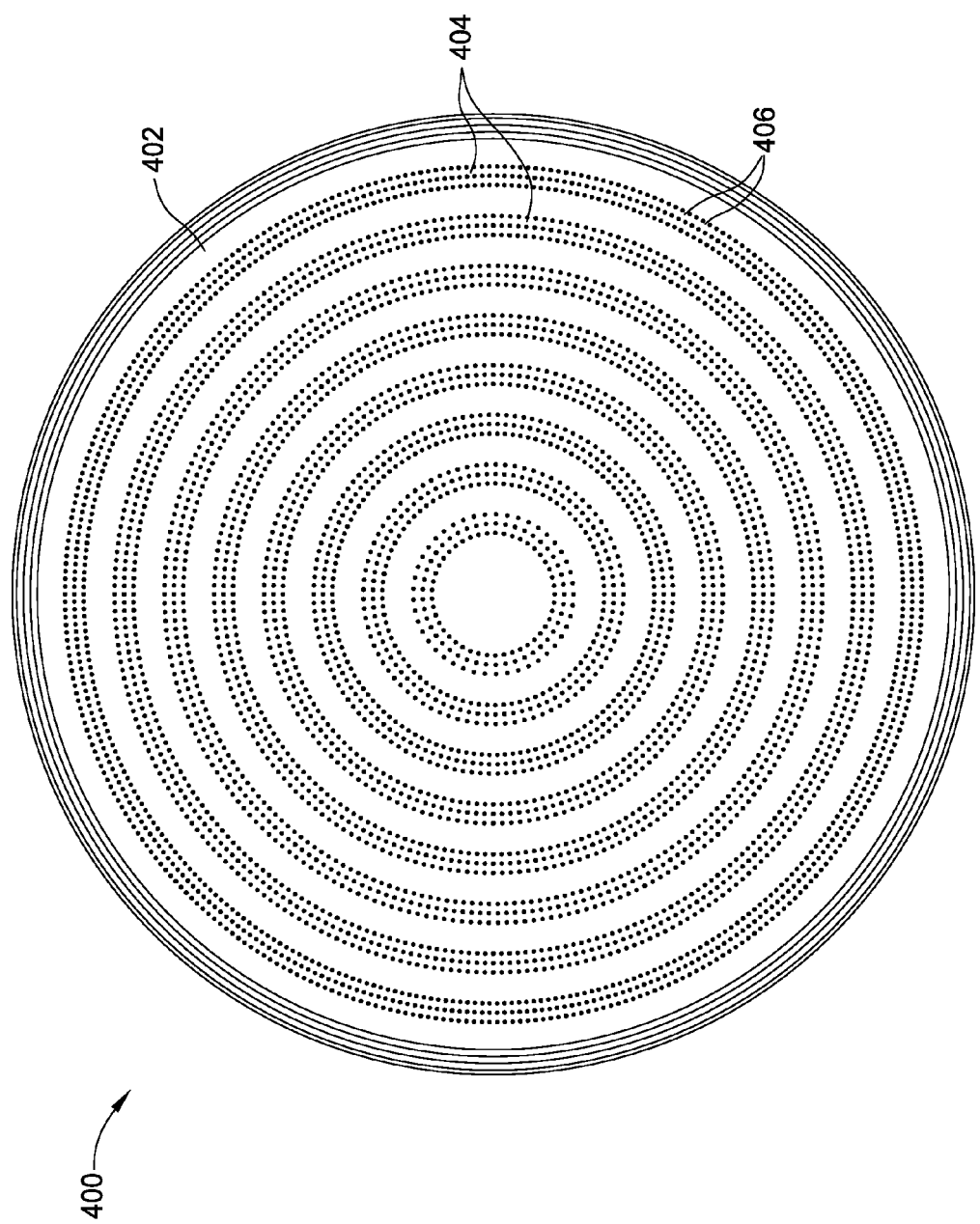
FIG. 4 is a schematic bottom view of a showerhead assembly 400 according to one embodiment of the disclosure.

FIG. 4 is a schematic bottom view of a showerhead assembly 400 according to one embodiment of the disclosure. The showerhead assembly 400 comprises a diffuser plate 402 having a plurality of annular patterns 404. Within each annular pattern, are annular patterns of openings 406. While three annular patterns of openings 406 are shown in each pattern 404, it is to be understood that more or less annular patterns of openings 406 may be present. Within the annular patterns 404, the annular patterns of openings 406 may be equally spaced apart. The annular patterns 404 may be equally spaced apart a distance shown by arrows "K". While eight annular patterns 404 are shown, it is to be understood that more or less annular patterns 404 may be present.

Figure 5:
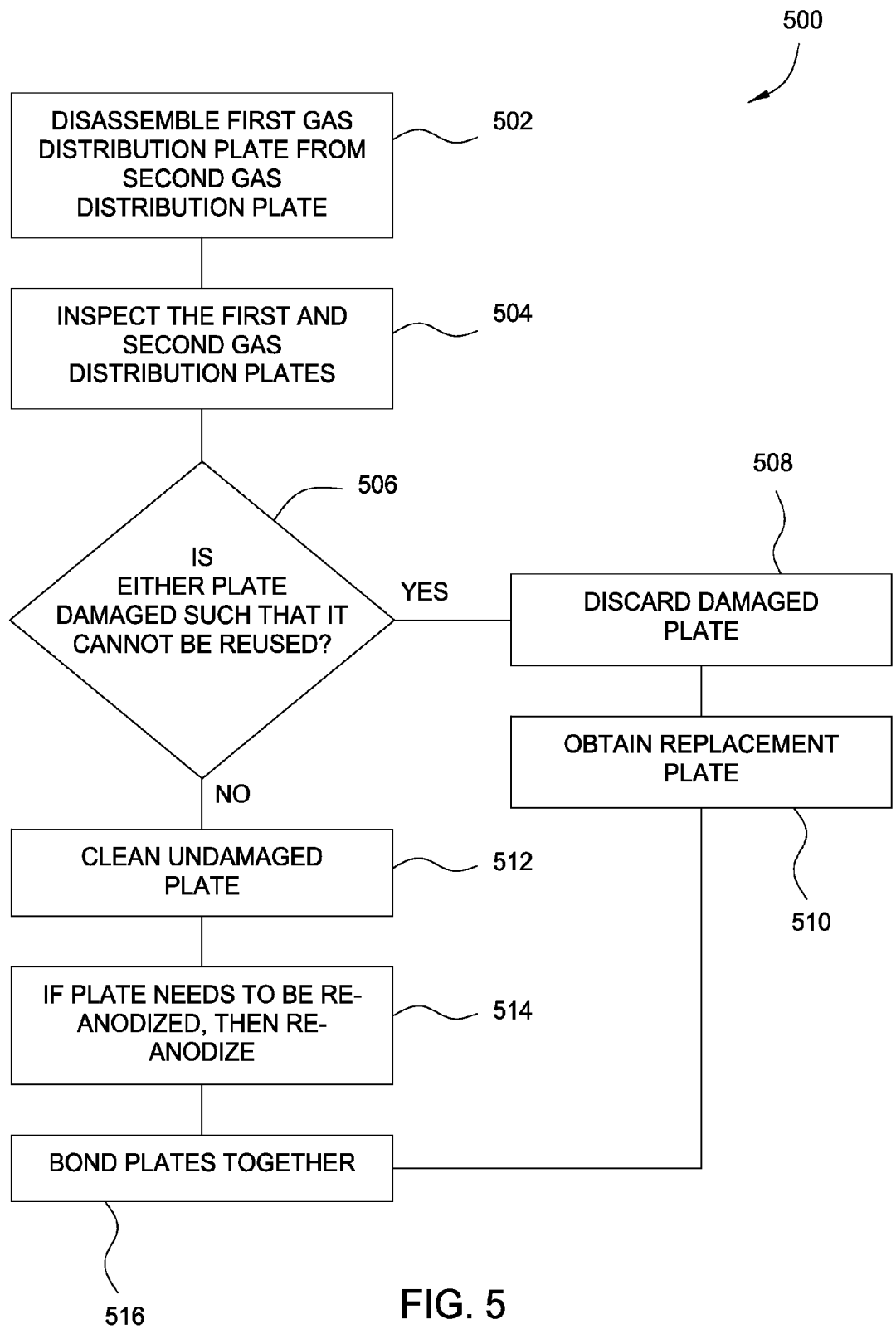
FIG. 5 is a flow chart showing the process steps of a refurbishment method according to one embodiment of the disclosure.

Once a showerhead assembly has been used for a length of time, the showerhead assembly may become dirty, the gas passageways may become blocked, or the showerhead assembly may degrade such that continued use of the showerhead assembly may not be advisable. In some situations, the showerhead assembly may be refurbished so that it may be used again. FIG. 5 is a flow chart 500 of a showerhead refurbishment method according to one embodiment of the disclosure.

Initially, the showerhead assembly may be disassembled (Step 502). The disassembly comprises disassembling the first gas distribution plate from the second gas distribution plate. The disassembly may comprise simply pulling the plates apart, heating the assembly to a temperature at or above the melting point of the material bonding the plates together, or cutting the plates apart.

After the assembly is disassembled, the first and second gas distribution plates are inspected (Step 504). The plates are inspected to determine whether they are reusable after a suitable cleaning, or whether they are damaged (Step 506). If a plate is damaged, uncleanable, or otherwise not usable, then the plate is discarded (Step 508) and a third or replacement plate is obtained (Step 510).

If one or more of the plates are cleanable, then the plate is cleaned (Step 512) to remove any bonding material from the plate as well as any material that may have deposited on the plate or within the gas passages. After the cleaning, the plate may need to be re-anodized (Step 514). Thereafter, the cleaned plates may be rebounded together, or in the case of a replacement plate, the cleaned plate may be bonded to the replacement plate (Step 516).

A showerhead having an inner zone and an outer zone may be beneficial in etching processes. Individual gas supply and temperature control of the zones may permit a technician to control the plasma within the processing chamber and compensate for the vacuum drawn in the chamber during processing.

While the foregoing is directed to embodiments of the present disclosure, other and further embodiments of the disclosure may be devised without departing from the basic scope thereof, and the scope thereof is determined by the claims that follow.

The invention claimed is:

1. A showerhead, comprising a showerhead body having:
   a first zone encircling a second zone, wherein the first zone has:
   a first plenum disposed on a first side of the body;
   a first heating element comprising a first plurality of heating coils;
   one or more second plenums disposed on the second side of the body; and
   a plurality of first bores arranged in a plurality of first annular patterns, the plurality of first bores extending from the first plenum to the one or more second plenums; and
   the second zone has:
   a third plenum disposed on the first side of the body;
   a second heating element comprising a second plurality of heating coils;
   one or more fourth plenums disposed on the second side of the body; and
   a plurality of second bores arranged in a plurality of second annular patterns, the plurality of second bores extending from the third plenum to the one or more fourth plenums.

2. The showerhead of claim 1, wherein the showerhead body comprises aluminum.

3. The showerhead of claim 1, wherein the one or more second plenums are arranged in a plurality of third annular patterns that match the plurality of first annular patterns and the one or more fourth plenums are arranged in a plurality of fourth annular patterns that match the plurality of second annular patterns.

4. The showerhead of claim 1, wherein the first heating element and the second heating element are tubular.

5. The showerhead of claim 1, wherein the first heating element and the second heating element are disconnected.

6. The showerhead of claim 5, wherein the second heating element is disposed radially inward the first plenum.

7. A showerhead, comprising a showerhead body having:
   a first zone encircling a second zone, wherein the first zone has:
   a first plenum disposed on a first side of the body;
   a first heating element comprising a first plurality of heating coils;
   one or more second plenums disposed on the second side of the body; and
   a plurality of first bores arranged in a plurality of first annular patterns, the plurality of first bores extending from the first plenum to the one or more second plenums, and wherein the plurality of first annular patterns is spaced apart by a first distance; and
   the second zone has:
   a third plenum disposed on the first side of the body;
   a second heating element comprising a second plurality of heating coils;
   one or more fourth plenums disposed on the second side of the body; and
   a plurality of second bores arranged in a plurality of second annular patterns, the plurality of second bores extending from the third plenum to the one or more fourth plenums, and wherein the plurality of second annular patterns is spaced apart by a second distance substantially equal to the first distance.

8. The showerhead of claim 7, wherein the showerhead body comprises aluminum.

9. The showerhead of claim 7, wherein the one or more second plenums are arranged in a plurality of third annular patterns that match the plurality of first annular patterns and the one or more fourth plenums are arranged in a plurality of fourth annular patterns that match the plurality of second annular patterns.

10. The showerhead of claim 7, wherein the plurality of the first annular pattern is spaced from the plurality of the second annular pattern by a third distance substantially equal to the first distance.

11. The showerhead of claim 7, wherein the first heating element and the second heating element are tubular.

12. The showerhead of claim 7, wherein the first heating element and the second heating element are disconnected.

13. The showerhead of claim 12, wherein the second heating element is disposed radially inward the first plenum.

* * * * *